(12) United States Patent
Toda et al.

(10) Patent No.: US 6,185,150 B1
(45) Date of Patent: Feb. 6, 2001

(54) CLOCK-SYNCHRONOUS SYSTEM

(75) Inventors: Haruki Toda, Yokohama; Kenji Tsuchida; Hitoshi Kuyama, both of Kawasaki, all of (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/448,412

(22) Filed: Nov. 23, 1999

(30) Foreign Application Priority Data

Nov. 27, 1998 (JP) .................................................. 10-337114

(51) Int. Cl.⁷ ...................................................... G11C 8/00
(52) U.S. Cl. .......................... 365/233; 365/191; 365/194
(58) Field of Search ..................................... 365/233, 194, 365/193, 191, 230.01, 189.01

(56) References Cited

U.S. PATENT DOCUMENTS

| | | | |
|---|---|---|---|
| 5,084,635 | 1/1992 | Toda et al. | 307/465 |
| 5,444,667 | 8/1995 | Obara | 365/233 |
| 5,581,512 | * 12/1996 | Kitamura | 365/233 |
| 5,636,173 | 6/1997 | Schaefer | 365/230.03 |
| 5,801,554 | 9/1998 | Momma et al. | 327/89 |
| 5,835,448 | * 11/1998 | Ohtani et al. | 365/233 |
| 5,867,447 | * 2/1999 | Koshikawa | 365/233 |

* cited by examiner

Primary Examiner—David Nelms
Assistant Examiner—Hoai V. Ho
(74) Attorney, Agent, or Firm—Banner & Witcoff, Ltd.

(57) ABSTRACT

A delay circuit produces an activation signal by delaying a clock signal by 270 degrees. A receiver circuit is responsive to the activation signal to capture a command latch enable signal indicating a command cycle and produce an internal signal corresponding to the command cycle. An AND circuit produces a command latch signal synchronized with the clock signal during an interval in which the internal signal is produced. Command receivers take command-forming signals only when the command latch signal is applied thereto. That is, these command receivers are activated only when the command latch signal is received but not at all times. This prevents power dissipation from increasing and allows a plurality of signals to be monitored reliably.

28 Claims, 4 Drawing Sheets

CLOCK-SYNCHRONOUS SYSTEM

BACKGROUND OF THE INVENTION

The present invention relates to a clock-synchronous system which is controlled in synchronization with a clock signal and which is applied to a semiconductor memory device, such as a synchronous dynamic random access memory (DRAM), and more particularly to a command receiver which receives a plurality of commands to instruct the system to perform various modes of operation.

This application is related to U.S. patent applications Ser. Nos. 09/305,752, 09/354,102, 09/383,193 and based on Japanese Patent Application No. 10-337114 filed Nov. 27, 1998, the contents of which are incorporated herein by reference and constitute part of the specification. The present invention is effectively used with high-speed semiconductor devices disclosed in U.S. patent applications Ser. Nos. 09/305,752, 09/354,102, and 09/383,193.

For example, in a system which is controlled in synchronization with a clock signal, as in a synchronous DRAM, an operating command is required to specify a certain operation mode. This command is formed from a plurality of signals. A plurality of commands is represented by combinations of the levels of those signals.

FIG. 4 shows an example of a conventional command receiver, which is composed of receiver circuits 11-0, 11-1, 11-2, 11-3, etc. The receiver circuits are respectively supplied with signals /CMD0, /CMD1, /CMD2, /CMD3, etc. that represent a command. Here, / indicates that the corresponding signal is active when it is at a low level. For example, the signals /CMD0, /CMD1, /CMD2, /CMD3 are a row address strobe signal /RAS, a column address signal /CAS, a write enable signal /WE, and an address signal /AD, respectively. The receiver circuits 11-0, 11-1, 11-2, 11-3, etc. are simultaneously activated by a command latch signal CL. The receiver circuits 11-0, 11-1, 11-2, 11-3, etc. latch the signals /CMD0, /CMD1, /CMD2, /CMD3, etc. with each cycle of the command latch signal CL and then output internal signals ICMD0, ICMD1, ICMD2, ICMD3, etc., which in turn are decoded by a decoder circuit not shown to produce a command.

FIG. 5 is a timing diagram illustrating the conventional command latch operation. The receiver circuits receive the signals /CMDi (i=0, 1, 2, . . . ) with each clock cycle of the command latch signal CL. When a combination of levels of those signals /CMDi corresponds to a given command, the system is placed in the operation mode that corresponds to that command. However, it is not known when each of the signals /CMDi changes and it is therefore required to generate the command latch signal CL for driving the receiver circuits with each cycle of the clock signal CLK.

FIG. 6 shows an example of the receiver circuit (CRCV) shown in FIG. 4. The receiver circuit (CRCV) is composed of a receiver circuit (RCV) and a flip-flop circuit FF connected to the outputs of the receiver circuit RCV. The receiver circuit RCV provides an output signal in the form of a pulse as will be described later. To produce a stable command from the pulse-form output signal, the outputs of the receiver circuit RCV are connected to the flip-flop circuit FF consisting of two cross-coupled NOR circuits.

FIG. 7 shows the operation of the circuit shown in FIG. 6. As shown, the flip-flop circuit FF holds the pulse-form signal /D or D output from the receiver circuit RCV and produces an internal signal ICMD. In this example, the flip-flop circuit FF receives the output signal /D to produce the internal signal ICMD and holds the state of the internal signal ICMD until the output signal D is received. By producing a command by combining internal signals ICMD having their respective state held in this manner, the state of the command is held stably. For this reason, the operation mode of the system that corresponds to the command can be held stably without using any special circuit.

FIG. 8 shows an example of the receiver circuit RCV shown in FIG. 6. This receiver circuit is formed of P-channel MOS transistors P1 to P5, N-channel MOS transistors N1 to N7, and inverters I1 and I2. The transistor N4 is supplied at its gate with a signal /CMD forming a command and the transistor N6 is supplied at its gate with a reference voltage Vref. The command latch signal CL is applied to the gates of the transistors N3, P3, P4 and P5.

FIG. 9 is a timing diagram illustrating the operation of the circuit of FIG. 8. The operation of the receiver circuit RCV shown in FIG. 8 will now be described with reference to this timing diagram. When the command latch signal CL goes to a high level as shown in FIG. 9, the transistor N3 is activated and the transistors P3 to P5 are deactivated. The transistors N5 and N7 are activated accordingly, so that the signal /CMD applied to the gate of the transistor N4 and the reference voltage Vref applied to the gate of the transistor N6 are taken into the receiver circuit RCV. That is, when the signal /CMD is higher in level than the reference voltage Vref, the connection node n1 between the transistors P1 and N1 goes to a low level and the connection node n2 between the transistors P2 and N2 goes to a high level. The node n1 is connected to the input of the inverter I1 and the node n2 is connected to the input of the inverter I2. Thus, the output signal D of the inverter I1 goes low and the output signal /D of the inverter I2 goes high.

When the signal /CMD is lower in level than the reference voltage Vref, on the other hand, the connection node n1 goes high, the connection node n2 goes low, the output signal D goes low, and the output signal /D goes high. When the command latch signal CL is low, the transistors P3 to P5 are activated, so that both the connection nodes n1 and n2 go high. Thus, the output signals D and /D are both held at a low level.

The receiver circuit RCV holds the state of the signal /CMD only when the command latch signal CL is activated. When the command latch signal CL is activated, a high current flows to sense the signal state at high speed, resulting in a considerable power dissipation.

As described above, in the conventional command receiver shown in FIG. 4, the receiver circuits are activated with each cycle of the clock signal to monitor the input signals because it is not known when the command state changes. Therefore, when the number of commands increases and hence the number of signals forming a command increases, the number of receiver circuits RCV that are activated with each cycle of the clock signal increases, and power dissipated by those receiver circuits increases. In addition, when the clock cycle time is reduced with increasing speed of circuit operation, the number of cycles per unit time increases, resulting in a further increase in power dissipation. Furthermore, it is difficult to adjust accurately all the high-speed receiver circuits so that they are equal to one another in setup time and hold time. In the event of differences among the receivers in signal capture time and hold time, wrong commands might be produced.

BRIEF SUMMARY OF THE INVENTION

It is therefore an object of the present invention to provide a clock-synchronous system which permits a plurality of signals to be monitored reliably without increasing power dissipation.

According to an aspect of the present invention, there is provided a clock-synchronous system comprising: a first receiver circuit for capturing an indication signal indicating an input signal capture cycle in synchronization with a clock signal; an activation signal producing circuit responsive to the indication signal for producing an activation signal; and a second receiver circuit responsive to the activation signal for capturing an input signal.

According to another aspect of the present invention, there is provided a clock-synchronous system comprising: a first activation signal producing circuit for producing a first activation signal with each clock of a clock signal; a first receiver circuit responsive to the first activation signal from the first activation signal producing circuit for capturing an indication signal for indicating an input signal capture cycle in which an input signal is to be captured; a second activation signal producing circuit responsive to the indication signal from the first receiver circuit for producing a second activation signal; and a second receiver circuit responsive to the second activation signal from the second activation signal producing circuit for capturing the input signal.

According to the present invention, the second receiver circuit is activated only when an input signal is applied but not at all times. Power dissipation can therefore be reduced. Moreover, the first receiver circuit can capture the signal capture cycle indication signal through its clock-synchronous operation and the second receiver circuit can capture the input signal in response to the activation signal corresponding to the indication signal, thus allowing the input signal to be monitored reliably.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, the preferred embodiment of the present invention will be described with reference to the accompanying drawings.

Figure 1:
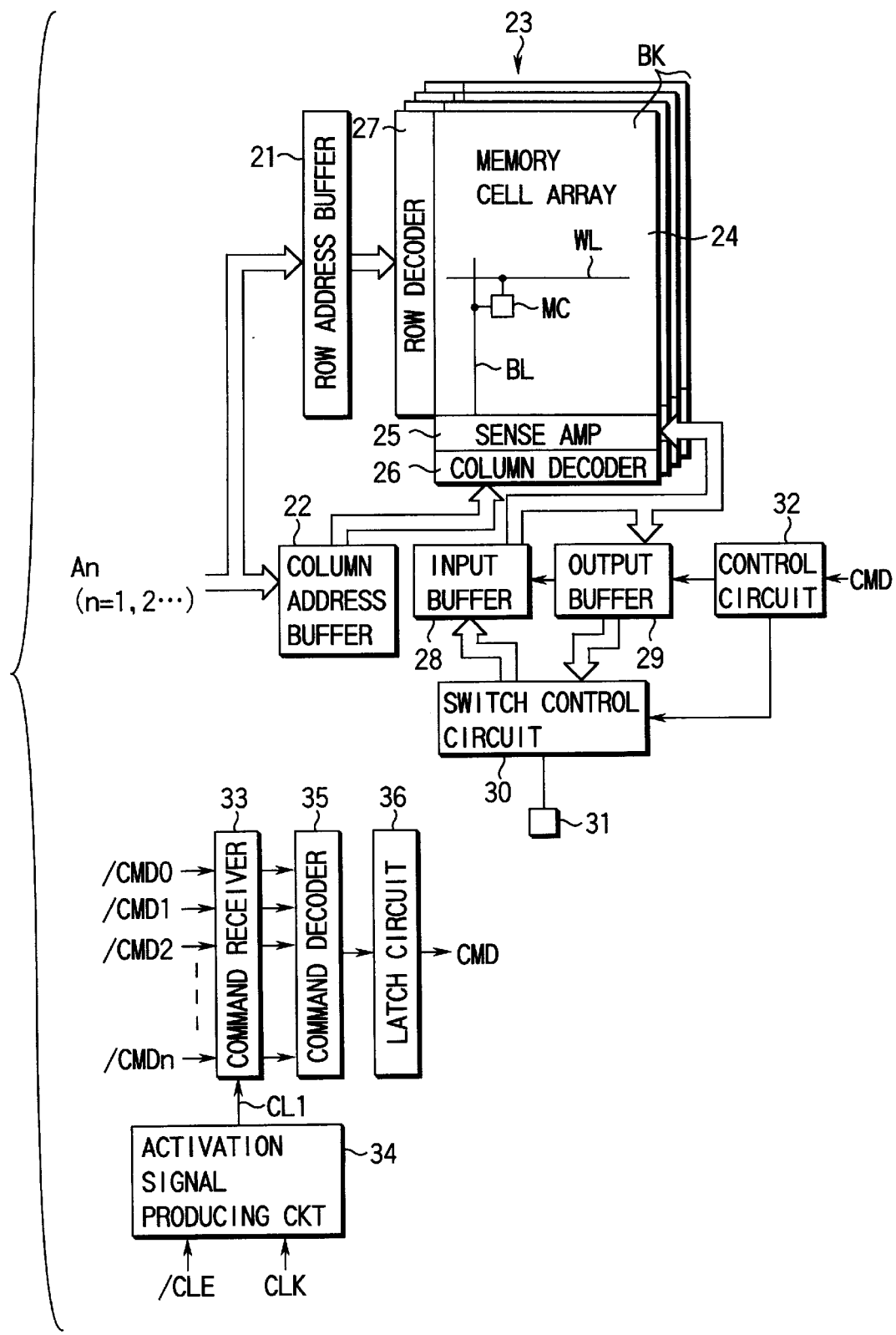
FIG. 1 is a schematic representation of a semiconductor memory device to which the present invention is applied.

Referring now to FIG. 1, there is illustrated an example of a synchronous DRAM which is one of the semiconductor devices to which the present invention is applied. In this figure, an address signal An (n=1, 2, . . . ) is applied through an address buffer circuit not shown to a row address buffer 21 and a column address buffer 22. The row address buffer 21 and the column address buffer 22 are connected to a memory block 23. The memory block 23 has a plurality of banks BK, each of which has a memory cell array 24, a sense amplifier 25, a column decoder 26, and a row decoder 27. The row decoder 27 is connected to the row address buffer 21 and selects a word line WL in response to a row address received from the row address buffer 21. The column decoder 26 is connected to the column address buffer 22 and selects a bit line BL in response to a column address from the column address buffer 22. A memory cell MC is placed at an intersection between a bit line BL and word line WL.

To the sense amplifier 25 are connected an input buffer 28 for holding write data and an output buffer 29 for holding read data, which are selectively connected to an input/output pad 31 by a switch control circuit 30. The input buffer 28, the output buffer 29 and the switch control circuit 30 are connected to a control circuit 32. The control circuit 32 controls the overall operation of the synchronous DRAM in response to an operation mode indicating signal from a latch circuit 36 to be described later.

Command forming signals /CMD0, /CMD1, /CMD2, . . . , /CMDn are supplied to a command receiver 33. The command receiver takes the signals /CMD0, /CMD1, /CMD2, . . . , /CMDn and produces internal signals corresponding to these signals in response to a command latch signal CL1 from an activation signal producing circuit 34 to be described later. The internal signals are applied to a command decoder 35, which decodes these internal signals to produce, for example, a bank activation command, a data read/write command, a latency switching command, or the like. An output command CMD from the command decoder 35 is applied to the control circuit 32 via the latch circuit 36.

Figures 2, 4:
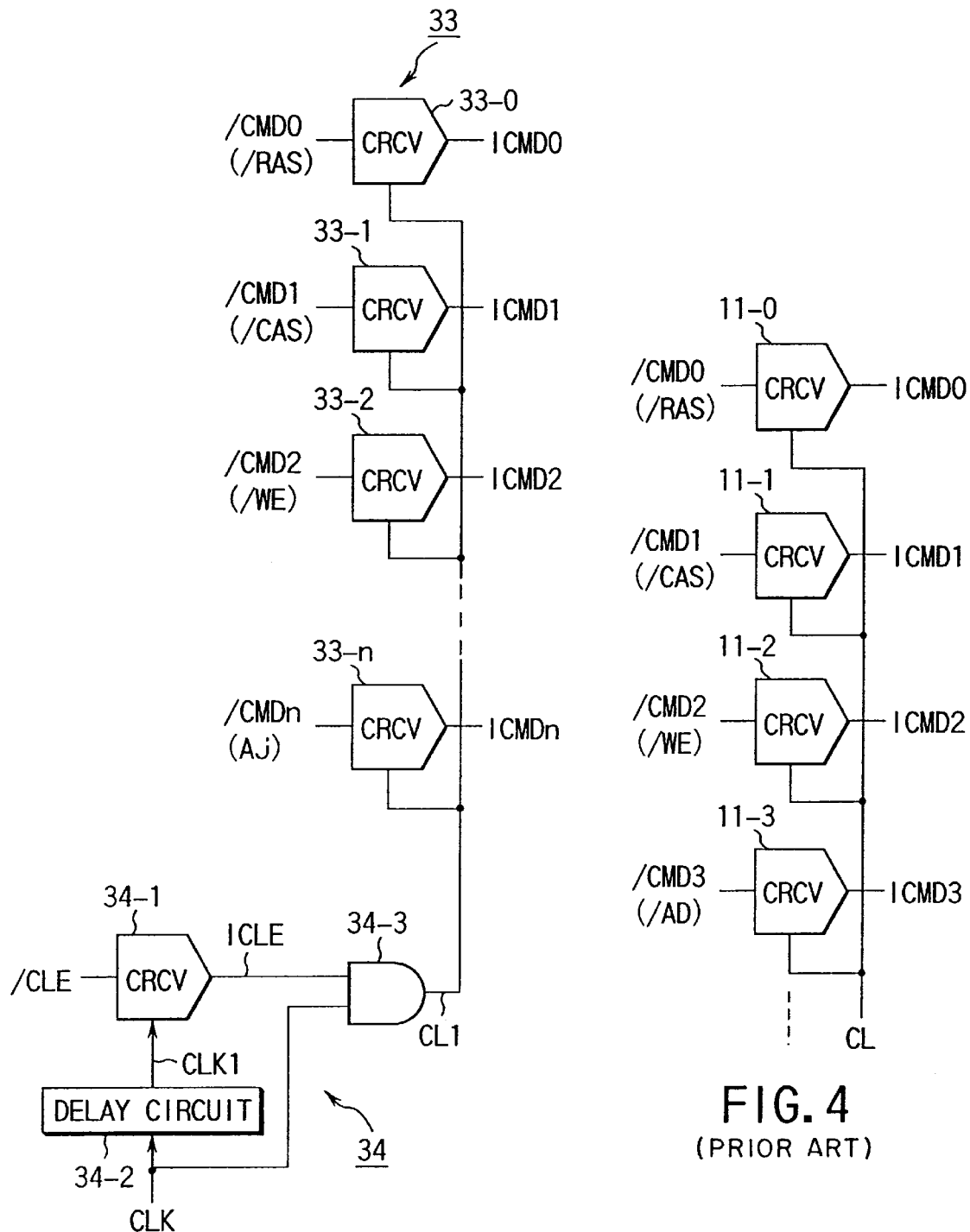
FIG. 2 shows a circuit arrangement according an embodiment of the present invention.
FIG. 4 shows a conventional command receiver.

FIG. 2 shows specific arrangements of the command receiver 33 and the activation signal producing circuit 34, like reference numerals and characters being used to denote corresponding parts to those in FIG. 1.

Figure 6:
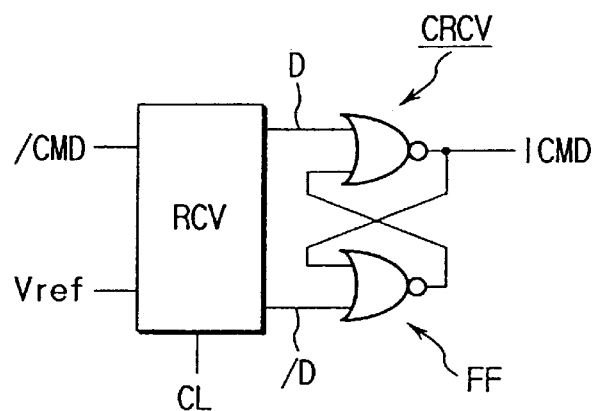
FIG. 6 shows a circuit arrangement of the receiver circuit CRCV shown in FIG. 4.
Figure 7:
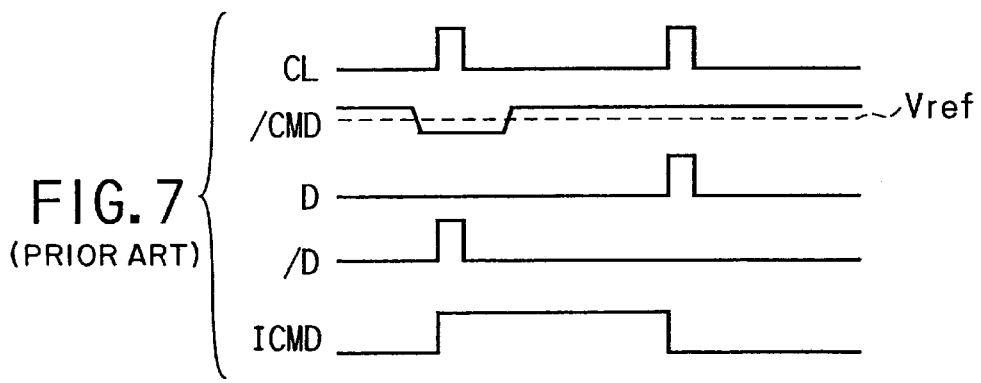
FIG. 7 is a timing diagram illustrating the operation of the circuit arrangement of FIG. 6.
Figure 8:
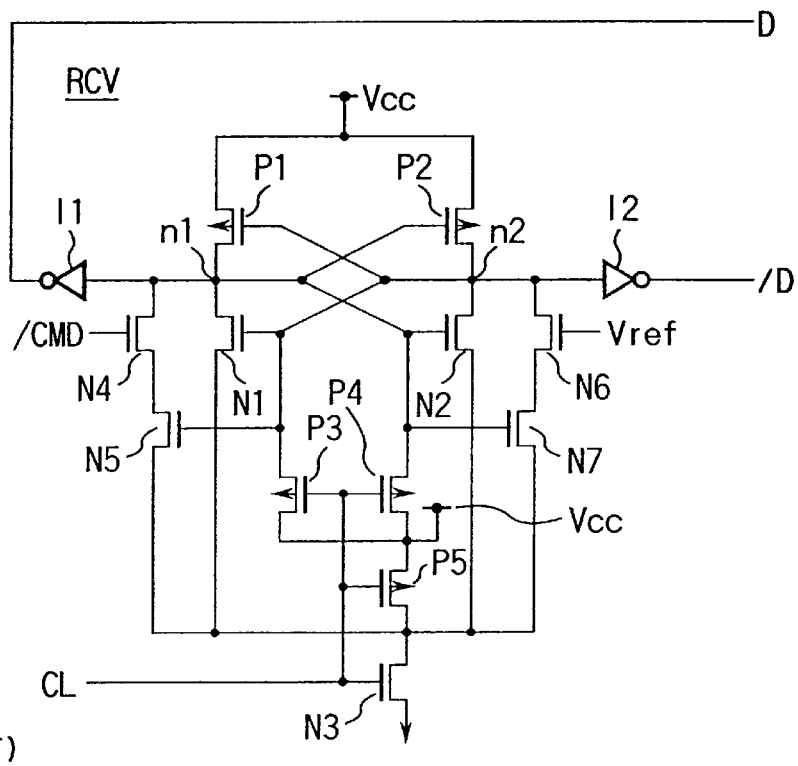
FIG. 8 shows a circuit arrangement of the receiver circuit RCV shown in FIG. 6.
Figure 9:
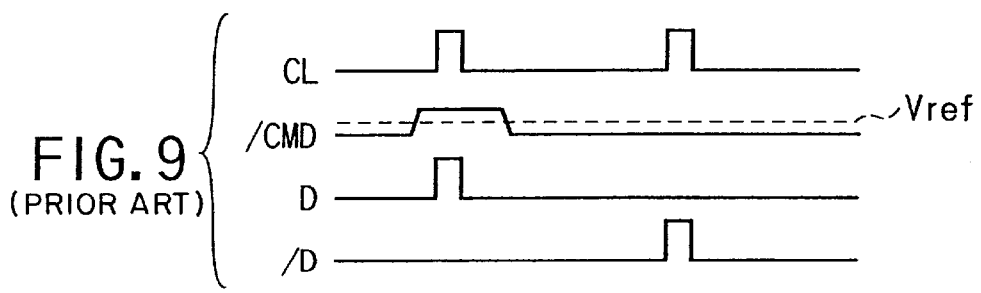
FIG. 9 is a timing diagram illustrating the operation of the circuit arrangement of FIG. 8.

The command receiver 33 is composed of a plurality of receiver circuits 33-0, 33-1, 33-2, . . . , 33-n, each of which is identical to the circuit arrangement shown in FIG. 6. It should however be noted that the reference voltage Vref is omitted in FIG. 2. The signals /CMD0, /CMD1, /CMD2, . . . , /CMDn which are respectively applied to the receiver circuits 33-0, 33-1, 33-2, . . . , 33-n are, for example, a row address strobe signal /RAS, a column address strobe signal /CAS, a write enable signal /WE, and a part of the address signal Aj. The receiver circuits 33-0, 33-1, 33-2, . . . , 33-n are simultaneously activated by the command latch signal CL1 supplied from the activation signal producing circuit 34, so that the signals /CMD0, /CMD1, /CMD2, . . . , /CMDn are taken into the receiver circuits 33-0, 33-1, 33-2, . . . , 33-n, respectively. The receiver circuits 33-0, 33-1, 33-2, , 33-n then output the internal signals ICMD0, ICMD1, ICMD2, . . . , ICMDn, respectively.

The activation signal producing circuit 34 is composed of a receiver circuit 34-1, a delay circuit 34-2, and an AND circuit 34-3. The receiver circuit 34-1 is identical in circuit arrangement to that shown in FIG. 6. Note that, in the receiver circuit 34-1, the reference voltage Vref is omitted. The receiver circuit 34-1 is supplied with a command latch enable signal /CLE that specifies a command cycle and an activation signal CLK1 and takes the command latch enable signal /CLE in response to the activation signal CLK1. The command latch enable signal /CLE indicates the timing of taking a command. For example, the signal /CLE indicates that command-forming signals appear in the cycle following it. The receiver circuit 34-1 takes the command latch enable signal /CLE to thereby output an internal signal ICLE at its output. The internal signal ICLE from the receiver circuit 34-1 is applied to the AND circuit 34-3 along with a clock signal CLK. In the AND circuit 34-3, the internal signal ICLE and the clock signal CLK are ANDed, so that the command latch signal CL1 is produced, which in turn is applied to the receiver circuits 33-0, 33-1, 33-2, . . . , 33-n.

Figure 3:
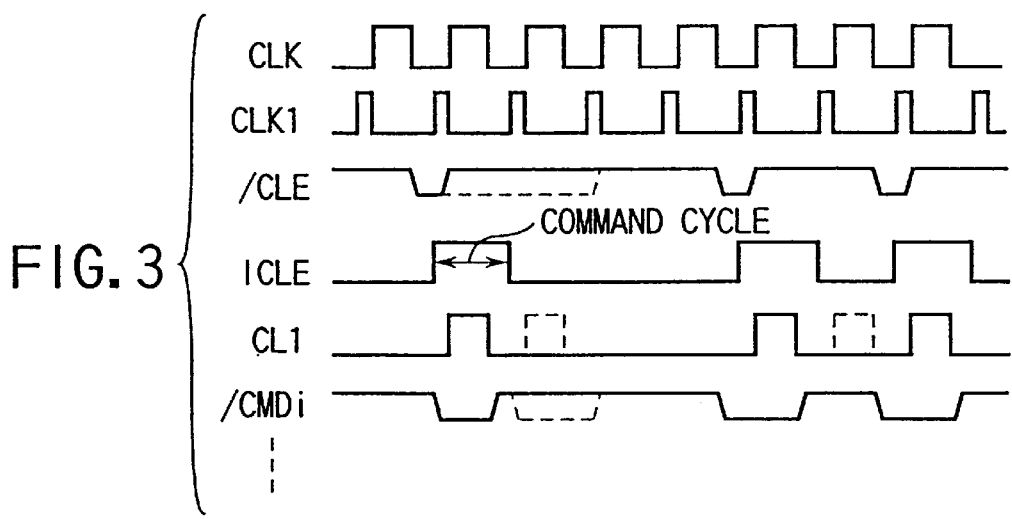
FIG. 3 is a timing diagram illustrating the operation of the circuit arrangement of FIG. 2.
Figure 5:
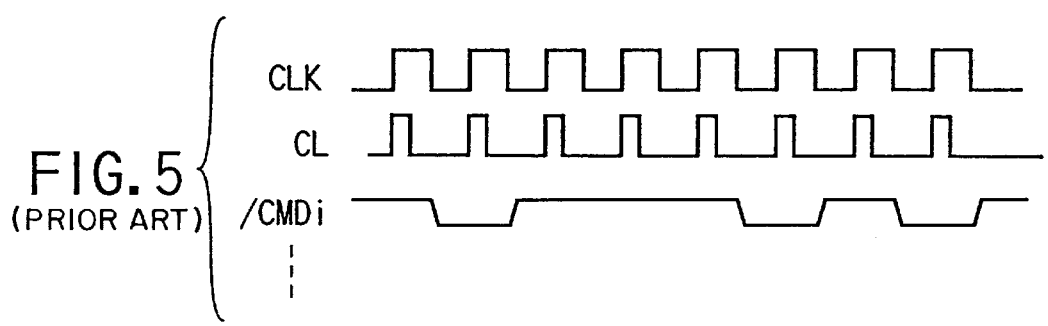
FIG. 5 is a timing diagram illustrating a conventional command capture operation.

Reference is now made to FIG. 3 to describe the operation of the circuit arrangement of FIG. 2. As shown in FIG. 3, the command latch enable signal /CLE goes to a low level immediately prior to a command cycle in which a command is captured. The command latch enable signal /CLE at low level is taken into the receiver circuit 34-1 by the activation signal CLK1 output from the delay circuit 34-2. The receiver circuit 34-1 then outputs the internal signal ICLE indicating a command cycle. The command latch enable signal /CLE is generated by a controller not shown and then applied to the input of the receiver circuit 34-1 as an external signal.

The receiver circuit 34-1 detects a change in the command latch enable signal /CLE so as to allow the command receivers 33 to take the signals /CMD0, /CMD1, /CMD2, . . . , /CMDn for which it is not known when a change occurs. For this reason, it is required to generate the activation signal CLK1 for driving the receiver circuit 34-1 with each cycle of the clock signal CLK as shown in FIG. 3. In this embodiment, the delay circuit 34-2 delays the phase of the clock signal CLK by, 270 degrees to produce the activation signal CLK1. The reason is that it is required to activate the receiver circuit 34-1 at the midpoint of each state holding interval of the command latch enable signal /CLE in order to take reliably the command latch enable signal /CLE which goes low during the second half of the clock cycle prior to a command cycle, that is, the half command cycle period ahead of the command cycle.

The circuit that produces the activation signal CLK1 is not limited to a delay circuit. For example, use may be made of a synchronous circuit, such as a phase locked loop (PLL), which allows the phase of a signal to be varied.

The timing of outputting the command latch enable signal /CLE and the timing of activating the receiver circuit 34-1 described in this embodiment are illustrative and not restrictive. It is only required to set the most suitable timing for the command-driven system. Although, in this embodiment, the activation signal CLK1 is generated with a delay of 270 degrees with respect to the clock signal CLK, this is not restrictive and it is only required to set the most suitable timing for the system.

The command latch enable signal /CLE taken into the receiver circuit 34-1 at the timing of the activation signal CLK1 from the delay circuit 34-2 is held during one clock cycle. This is because the state of the command latch enable signal /CLE is monitored every cycle.

FIG. 3 shows the state where the command latch enable signal /CLE has been taken and the internal signal ICLE is being held. The interval when the internal signal ICLE is at a high level forms a command cycle. The states of the command-forming signals are taken on a rising edge of the clock signal CLK within the command cycle. That is, the internal signal ICLE output from the receiver circuit 34-1 is applied to the AND circuit 34-3 along with the clock signal CLK and the command latch signal CL1 is then produced at the output of the AND circuit. The command latch signal CL1 is applied to the receiver circuits 33-0, 33-1, 33-2, . . . , 33-n. The command latch signal CL1 is generated only in the command cycles as shown in FIG. 3 and not at any other time. When activated by the command latch signal CL1, the receiver circuits 33-0, 33-1, 33-2, , 33-n take the command-forming signals /CMD0, /CMD1, /CMD2, . . . , /CMDn, respectively. That is, the receiver circuits 33-0, 33-1, 33-2, . . . , 33-n are activated only in that interval in each command cycle when the command latch signal CL1 is generated and output the internal signals ICMD0, ICMD1, ICMD2, . . . , ICMDn corresponding to the signals /CMD0, /CMD1, /CMD2, . . . , /CMDn.

According to the embodiment described so far, only the receiver circuit 34-1 is activated with each clock by the clock-synchronous activation signal CLK1 and the receiver circuits 33-0, 33-1, 33-2, . . . , 33-n are activated only in command cycles and not with each clock. Thus, it is only the receiver circuit 34-1 that operates at all times and the receiver circuits 33-0, 33-1, 33-2, . . . , 33-n are deactivated in other intervals than the command cycles. The present invention can therefore reduce power dissipation significantly in comparison with the prior art.

In addition, the command-forming signals /CMD0, /CMD1, /CMD2, . . . , /CMDn are required to have their respective state fixed only at the beginning of each command cycle specified by the command latch enable signal /CLE and not required to be fixed in synchronization with a high-rate clock signal. It is difficult to fix simultaneously a plurality of signals that form a command in synchronization with a high-rate clock signal.

With this embodiment, however, it is only required to fix a plurality of signals that form a command in synchronization with the command latch enable signal /CLE that is generated at a lower rate than the clock signal CLK. Therefore, those signals can be produced readily.

Furthermore, because the receiver circuits 33-0, 33-1, 33-2, . . . , 33-n are not activated with each clock by a high-rate clock signal, it is difficult for displacements to occur in the signal capture timing and the signal hold time. Thus, the probability of producing wrong internal signals can be lowered. That is, if the receiver circuits 33-0, 33-1, 33-2, . . . , 33-n are activated with each clock by a high-rate clock signal, then the potential at their respective internal connection node may not be reset sufficiently. This may cause displacements of the signal capture timing and the signal hold time. In this embodiment, however, the receiver circuits 33-0, 33-1, 33-2, . . . , 33-n are activated only when the command latch signal CL1 and not with each clock. Therefore, the potential at the internal connection node can be reset sufficiently, allowing the receiver circuits 33-0, 33-1, 33-2, . . . , 33-n to match with one another in the signal capture timing and the signal hold time. Hence, the probability of producing wrong internal signals can be lowered.

Although the present invention has been described in terms of one specific application to a synchronous DRAM, this is not restrictive and the principles of the invention are applicable to an address latch circuit that takes a signal in synchronization with a clock signal, a system that receives a command in synchronization with a clock signal, etc.

Moreover, the present invention is also applicable to a data receiver circuit that is responsive to a command to take data in synchronization with a clock signal.

Furthermore, although the aforementioned embodiment is adapted to take all the command-forming signals in one cycle of a clock signal, the present invention is also applicable to a system that takes command-forming signals in two or more clock cycles and not in one clock cycle, as in a DRAM that conforms to Rambus by way of example. In such a case, it is required that the command latch enable signal /CLE be held at a low level during more than one clock cycle as indicated by dashed lines in FIG. 3.

In addition, although, in the aforementioned embodiment, the command latch signal CL1 is generated immediately after the command latch enable signal /CLE, this is not restrictive. For example, the command latch signal CL1 may be generated several cycles after the command latch enable signal /CLE as indicated by dashed lines in FIG. 3 provided that the relationship between the command latch enable signal /CLE and the command-forming signals is definite.

Furthermore, the circuit arrangement of the receiver circuits 33-0, 33-1, 33-2, . . . , 33-n and 34-1 is not limited to that shown in FIG. 6 and they may be arranged otherwise.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A clock-synchronous system comprising:
    a first activation signal producing circuit for producing a first activation signal with each clock of a clock signal;
    a first receiver circuit responsive to the first activation signal from the first activation signal producing circuit for capturing an indication signal for indicating an input signal capture cycle in which an input signal is to be captured, the first receiver circuit producing an internal signal corresponding to the indication signal;
    a second activation signal producing circuit connected to receive the internal signal produced by the first receiver circuit and the clock signal for producing a second activation signal synchronous with the clock signal during an interval when the internal signal is produced; and
    a second receiver circuit responsive to the second activation signal from the second activation signal producing circuit for capturing the input signal.

2. A system according to claim 1, wherein the first activation signal producing circuit produces the first activation signal during the cycle of the clock signal immediately prior to the input signal capture cycle.

3. A system according to claim 1, wherein the first activation signal producing circuit produces the first activation signal in the second half of each cycle of the clock signal.

4. A system according to claim 1, wherein the first activation signal producing circuit comprises a delay circuit.

5. A system according to claim 1, wherein the indication signal has a period corresponding to a plurality of cycles of the clock signal.

6. A system according to claim 1, wherein the second activation signal is separated from the first activation signal by a plurality of clocks.

7. A clock-synchronous system comprising:
    a memory that operates in synchronization with a clock signal;
    a first activation signal producing circuit for producing a first activation signal with each clock of the clock signal;
    a first receiver circuit responsive to the first activation signal from the first activation signal producing circuit for capturing an indication signal for indicating an input signal capture cycle in which a plurality of input signals that form a command are to be captured, the first receiver circuit producing an internal signal corresponding to the indication signal;
    a second activation signal producing circuit connected to receive the internal signal produced by the first receiver circuit and the clock signal for producing a second activation signal synchronized with the clock signal during an interval when the internal signal is produced; and
    a plurality of second receiver circuits responsive to the second activation signal from the second activation signal producing circuit for capturing the input signals that form a command;
    a decoder for decoding output signals of the second receiver circuits to produce the command; and
    a control circuit responsive to the command from the decoder for controlling the memory.

8. A system according to claim 7, wherein the first activation signal producing circuit produces the first activation signal during the cycle of the clock signal immediately prior to the input signal capture cycle.

9. A system according to claim 7, wherein the first activation signal producing circuit produces the first activation signal in the second half of each cycle of the clock signal.

10. A system according to claim 7, wherein the first activation signal producing circuit comprises a delay circuit.

11. A system according to claim 7, wherein the indication signal has a period corresponding to a plurality of cycles of the clock signal.

12. A system according to claim 7, wherein the second activation signal is separated from the first activation signal by a plurality of clocks.

13. A clock-synchronous system comprising:
    a first receiver circuit for capturing an indication signal indicating an input signal capture cycle in synchronization with a clock signal, said first receiver circuit outputting an internal signal when the indication signal is captured;
    an activation signal producing circuit for producing an activation signal responsive to the internal signal supplied from the first receiver circuit and the clock signal; and
    a second receiver circuit for capturing the input signal responsive to the activation signal supplied from the activation signal producing circuit.

14. A system according to claim 13, wherein the first receiver circuit is activated in synchronization with the clock signal and the second receiver circuit is activated by the activation signal that is asynchronous with the clock signal.

15. A system according to claim 13, wherein the indication signal is produced with a delay with respect to the clock signal.

16. A system according to claim 13, wherein signals other than the indication signal are fixed in synchronization with the indication signal.

17. A clock-synchronous system comprising:
    a first activation signal producing circuit for producing a first activation signal with each clock of a clock signal;
    a first receiver circuit responsive to the first activation signal supplied from the first activation signal producing circuit for capturing an indication signal for indicating an input signal capture cycle in which an input signal is to be captured, said first receiver circuit outputting an internal signal when the indication signal is captured;

a second activation signal producing circuit for producing a second activation signal responsive to the internal signal supplied from the first receiver circuit and the clock signal; and a second receiver circuit for capturing the input signal responsive to the second activation signal supplied from the second activation signal producing circuit.

18. A system according to claim 17, wherein the first receiver circuit is activated in synchronization with the clock signal and the second receiver circuit is activated by the activation signal that is asynchronous with the clock signal.

19. A system according to claim 17, wherein the indication signal is produced with a delay with respect to the clock signal.

20. A system according to claim 17, wherein signals other than the indication signal are fixed in synchronization with the indication signal.

21. A clock-synchronous system comprising:

a first receiver circuit for capturing an indication signal indicating an input signal capture cycle in synchronization with a clock signal, said first receiver circuit outputting an internal signal when the indication signal is captured;

an activation signal producing circuit for producing an activation signal responsive to the internal signal supplied from the first receiver circuit, said activation signal producing circuit producing the activation signal during an interval when the internal signal is supplied; and a second receiver circuit for capturing the input signal responsive to the activation signal supplied from the activation signal producing circuit.

22. A system according to claim 21, wherein the first receiver circuit is activated in synchronization with the clock signal and the second receiver circuit is activated by the activation signal that is asynchronous with the clock signal.

23. A system according to claim 21, wherein the indication signal is produced with a delay with respect to the clock signal.

24. A system according to claim 21, wherein signals other than the indication signal are fixed in synchronization with the indication signal.

25. A clock-synchronous system comprising:

a first activation signal producing circuit for producing a first activation signal with each clock of a clock signal;

a first receiver circuit responsive to the first activation signal supplied from the first activation signal producing circuit for capturing an indication signal for indicating an input signal capture cycle in which an input signal is to be captured, said first receiver circuit outputting an internal signal when the indication signal is captured;

a second activation signal producing circuit for producing a second activation signal responsive to the internal signal supplied from the first receiver circuit, said second activation signal producing circuit producing the second activation signal during an interval when the internal signal is supplied; and a second receiver circuit for capturing the input signal responsive to the second activation signal supplied from the second activation signal producing circuit.

26. A system according to claim 25, wherein the first receiver circuit is activated in synchronization with the clock signal and the second receiver circuit is activated by the activation signal that is asynchronous with the clock signal.

27. A system according to claim 25, wherein the indication signal is produced with a delay with respect to the clock signal.

28. A system according to claim 25, wherein signals other than the indication signal are fixed in synchronization with the indication signal.

* * * * *